US009369088B2

(12) United States Patent
Takahashi et al.

(10) Patent No.: US 9,369,088 B2
(45) Date of Patent: Jun. 14, 2016

(54) AMPLIFIER

(71) Applicant: Panasonic Corporation, Osaka (JP)

(72) Inventors: Kouji Takahashi, Shiga (JP); Shigeki Nakamura, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 12 days.

(21) Appl. No.: 14/391,583

(22) PCT Filed: Feb. 7, 2014

(86) PCT No.: PCT/JP2014/000671
§ 371 (c)(1),
(2) Date: Oct. 9, 2014

(87) PCT Pub. No.: WO2014/132577
PCT Pub. Date: Sep. 4, 2014

(65) Prior Publication Data
US 2015/0084697 A1   Mar. 26, 2015

(30) Foreign Application Priority Data

Feb. 26, 2013   (JP) .................. 2013-035618

(51) Int. Cl.
*H03F 3/16* (2006.01)
*H03F 1/02* (2006.01)
*H03F 3/21* (2006.01)
*H03F 1/22* (2006.01)
(Continued)

(52) U.S. Cl.
CPC ............. *H03F 1/0205* (2013.01); *H03F 1/223* (2013.01); *H03F 3/08* (2013.01); *H03F 3/193* (2013.01);
(Continued)

(58) Field of Classification Search
CPC ............... H03F 3/14; H03F 3/16; H03F 3/68
USPC .......................... 330/277, 295, 307
See application file for complete search history.

(56) References Cited

U.S. PATENT DOCUMENTS 6,002,156 A * 12/1999 Lin .................. H01L 27/0277
257/356
6,654,916 B1   11/2003 Furukawa
(Continued)

FOREIGN PATENT DOCUMENTS

JP   03-020082 A    1/1991
JP   2000-323966 A  11/2000
(Continued)

OTHER PUBLICATIONS

International Search Report for Application No. PCT/JP2014/000671 Apr. 8, 2014.

*Primary Examiner* — Steven J Mottola
(74) *Attorney, Agent, or Firm* — Pearne & Gordon LLP (57) ABSTRACT

An amplifier is disclosed that avoids an increase in circuit scale and an increase in power consumption, and easily avoids the odd-order harmonics. This amplifier includes a MOS transistor including a plurality of gate fingers or a plurality of MOS transistors each including a single gate finger; a dielectric capacitor that is added to each of the gate fingers; and a variable resistor that is connected between an input terminal to which an AC signal is input, and a gate input terminal. In the amplifier, the variable resistor, gate resistors of the respective gate fingers, and the dielectric capacitors form a plurality of low pass filters having desired frequency characteristics, and the gate fingers are different from each other in width or length from the gate input terminal to an oxide diffusion (OD) area boundary.

11 Claims, 9 Drawing Sheets

(51) Int. Cl.
  *H03F 3/195* (2006.01)
  *H03F 3/24* (2006.01)
  *H03F 3/30* (2006.01)
  *H03F 3/193* (2006.01)
  *H04B 1/04* (2006.01)
  *H03F 3/08* (2006.01)

(52) U.S. Cl.
  CPC .................. *H03F 3/195* (2013.01); *H03F 3/21* (2013.01); *H03F 3/211* (2013.01); *H03F 3/245* (2013.01); *H03F 3/3028* (2013.01); *H04B 1/0475* (2013.01); *H03F 2200/171* (2013.01); *H03F 2200/408* (2013.01); *H03F 2200/411* (2013.01); *H03F 2200/451* (2013.01); *H03F 2200/555* (2013.01); *H04B 2001/0408* (2013.01)

(56) References Cited

U.S. PATENT DOCUMENTS

| | | |
|---|---|---|
| 2009/0278207 A1 | 11/2009 | Greenberg et al. |
| 2011/0210792 A1 | 9/2011 | Kawakami |
| 2012/0112819 A1 | 5/2012 | Greenberg et al. |
| 2012/0262237 A1 | 10/2012 | Kawakami |

FOREIGN PATENT DOCUMENTS

| | | |
|---|---|---|
| JP | 2011-524079 A | 8/2011 |
| JP | 2011-182107 A | 9/2011 |
| WO | 2008/032782 A1 | 3/2008 |

\* cited by examiner

AMPLIFIER

TECHNICAL FIELD

The present invention relates to an amplifier using a metal-oxide-semiconductor (MOS) transistor.

BACKGROUND ART

For example, there is an amplifier as a circuit that outputs a large-amplitude signal to radiate a radio wave from an antenna.

Figure 1:
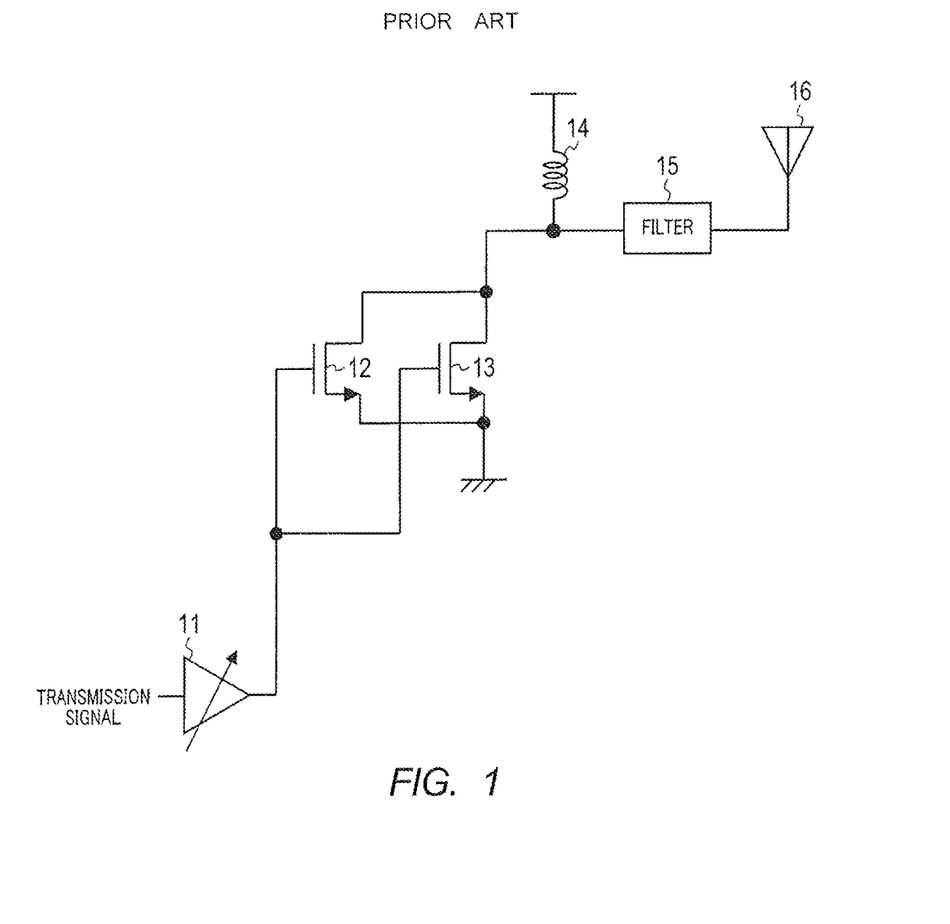
FIG. 1 is a circuit diagram that illustrates a configuration of a typical amplifier.

Conventionally, as illustrated in FIG. 1, a circuit has been widely used as an amplifier, which includes N-channel MOS switching transistors 12 and 13, inductor 14, and band pass filter 15, and which uses a pulse waveform signal (transmission signal) amplified by gain control buffer 11 as an input of the amplifier. In addition, the output of the amplifier is radiated from antenna 16.

Figure 2:
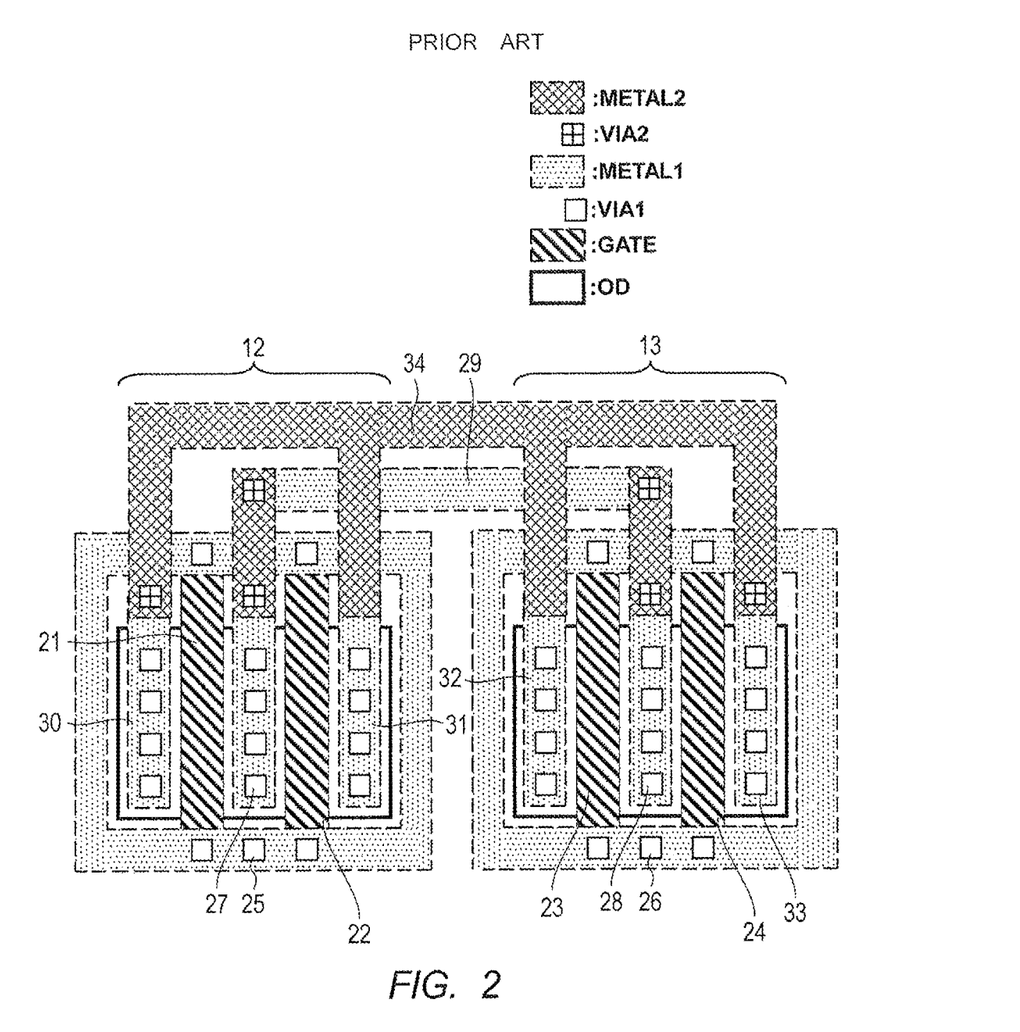
FIG. 2 is a plan view that illustrates a layout of N-channel MOS switching transistors.

FIG. 2 is a plan view that illustrates a layout of N-channel MOS switching transistors 12 and 13. In FIG. 2, both ends of gate fingers 21 and 22 are connected to a metal wire (METAL1 in the drawing) having input terminal 25 through which an input signal is input, and both ends of gate fingers 23 and 24 are connected to a metal wire (METAL1 in the drawing) having input terminal 26 through which an input signal is input.

One ends of drains 27 and 28 are connected to output terminal 29, and one ends of sources 30 to 33 are connected to bulk 34 so as to be grounded.

However, in this configuration, the output of the amplifier is a signal of a pulse-like waveform and is a signal containing harmonic components.

Figure 3:
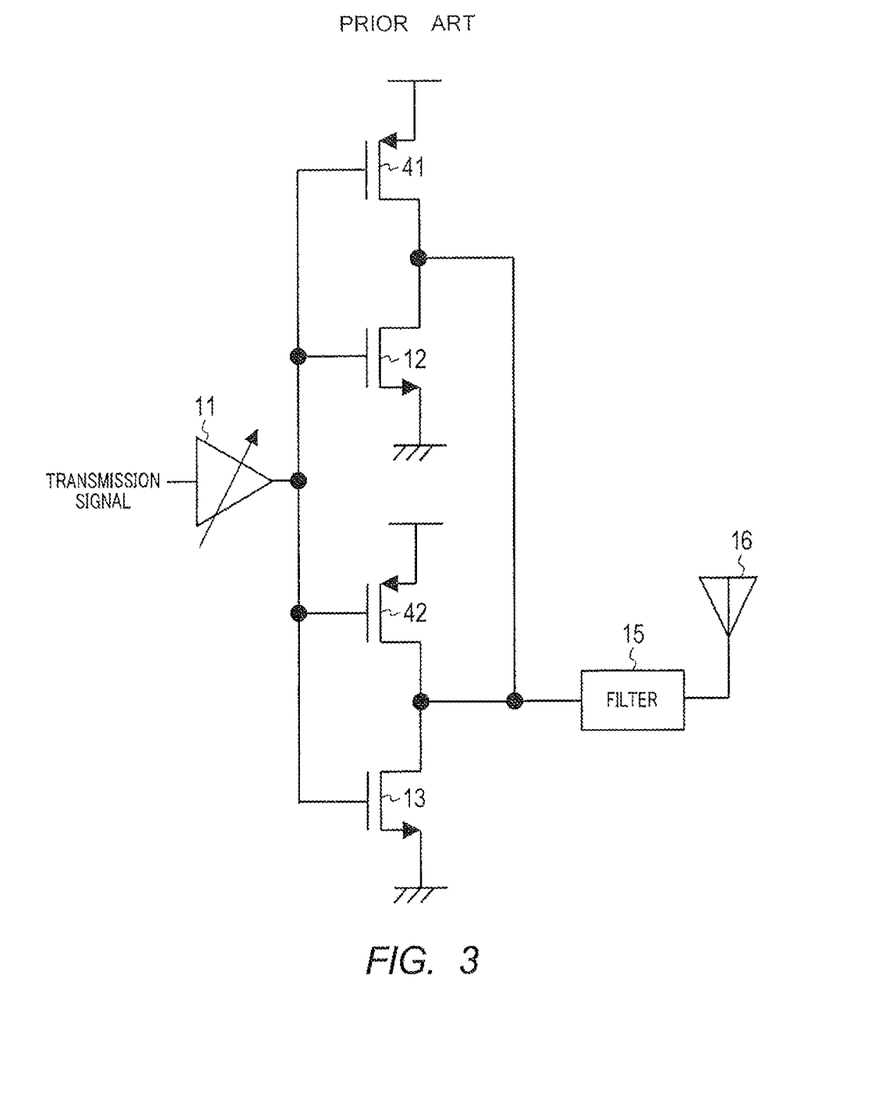
FIG. 3 is a circuit diagram that illustrates a configuration of a pulse-type amplifier using an inverter.

In addition, as illustrated in FIG. 3 unlike FIG. 1, there is a pulse-type amplifier using an inverter which includes N-channel MOS switching transistors 12 and 13 and P-channel MOS switching transistors 41 and 42. Even in this configuration, harmonic waves are generated in the output.

Conventionally, in order to avoid odd-order harmonics in particular, a circuit has been proposed in which duty ratios and phases of the pulse waves input from a plurality of amplifiers are independently set, and the outputs of the plurality of amplifiers are combined (see, Patent Literature (hereinafter, abbreviated as PTL) 1, for example).

Figure 4:
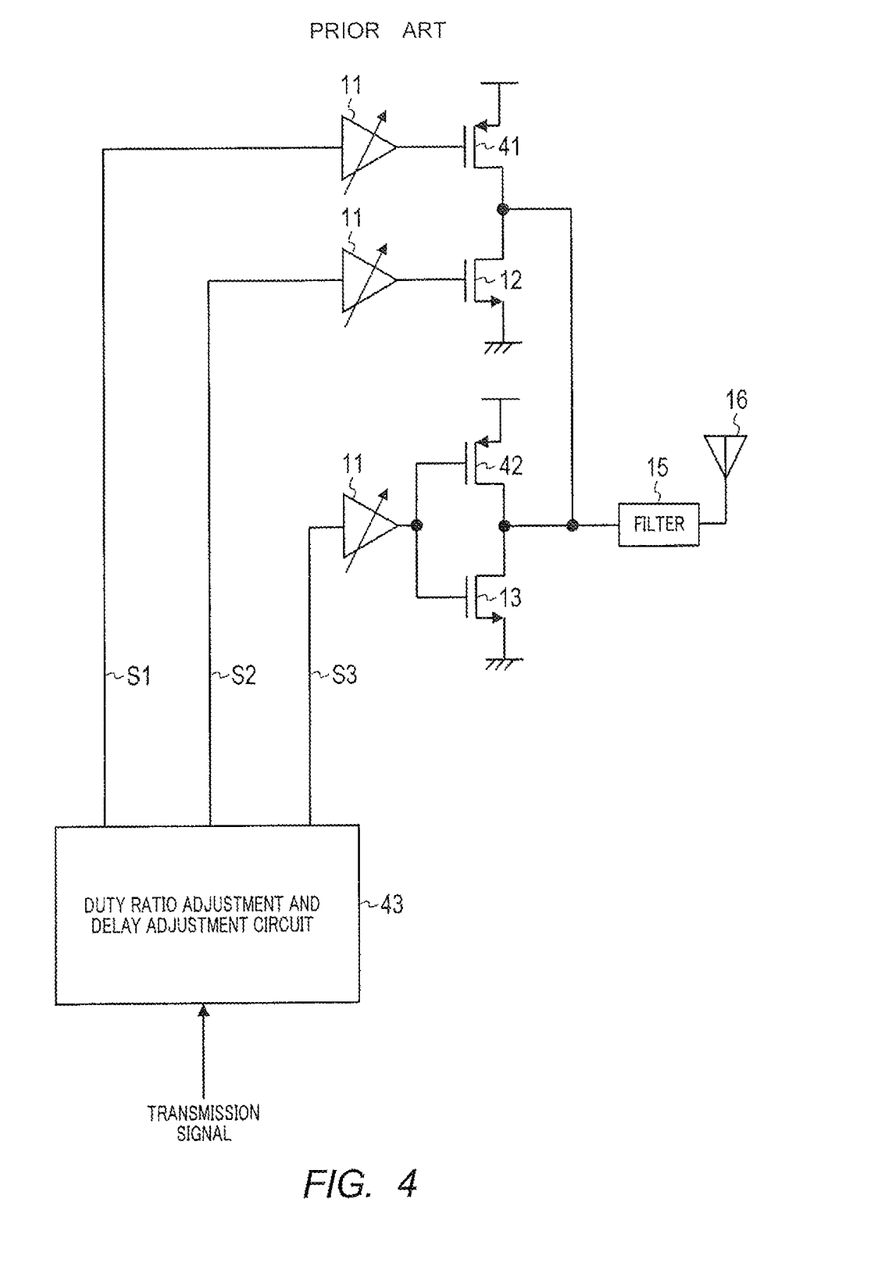
FIG. 4 is a circuit diagram that illustrates a configuration of an amplifier described in PTL 1.
Figure 5:
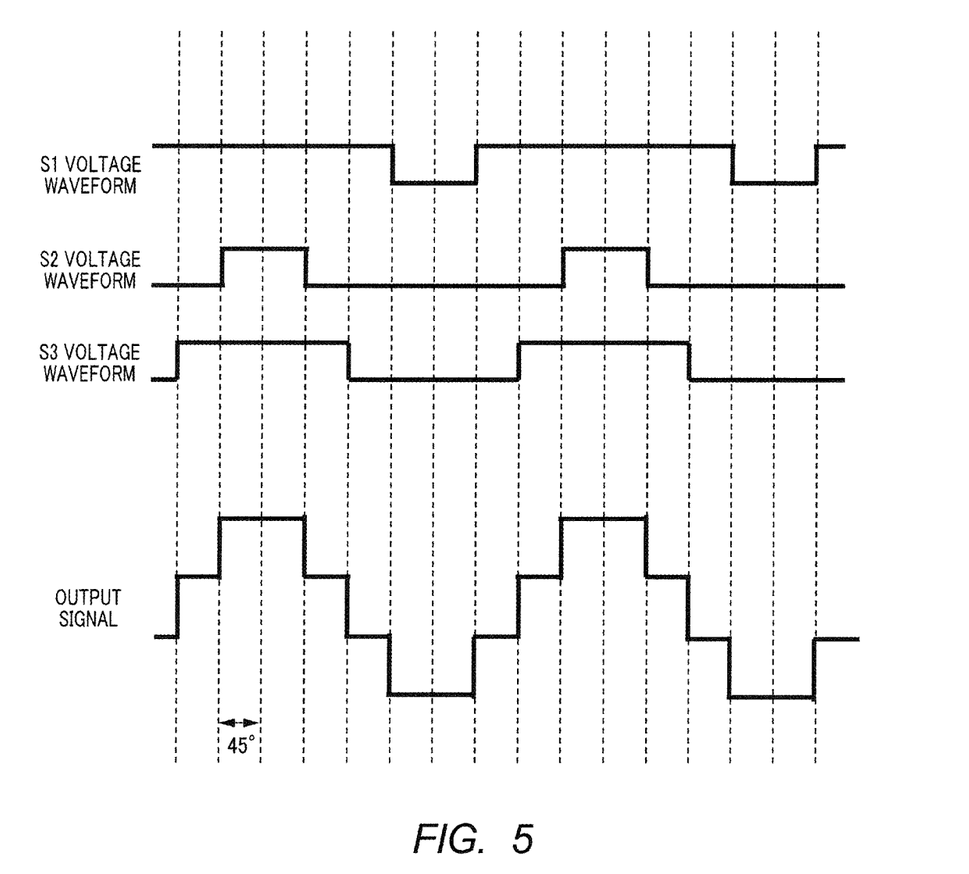
FIG. 5 is a timing chart that illustrates signal waveforms of respective portions of the amplifier of FIG. 4.

FIG. 4 is a circuit diagram that illustrates a configuration of the amplifier described in PTL 1, and FIG. 5 is a timing chart that illustrates signal waveforms of the respective portions of the amplifier of FIG. 4. The amplifier of FIG. 4 generates an output signal by combining the output of an inverter which includes N-channel MOS transistor 13 and P-channel MOS transistor 42 and the output of an inverter which includes N-channel MOS transistor 12 and P-channel MOS transistor 41. The duty ratios and the phases of switching transistor input signals S1 to S3 are independently set by duty ratio adjustment and delay adjustment circuit 43 as the voltage waveforms illustrated in FIG. 5, so that the waveform of the output signal is made close to a sine waveform to avoid the odd-order harmonics.

CITATION LIST

Patent Literature

PTL 1

International Publication No. WO2008/032782 A1

SUMMARY OF INVENTION

Technical Problem

However, the amplifier of FIG. 4 needs a duty adjustment circuit and a delay adjustment circuit in order to avoid the harmonics (in particular, the odd-order harmonics). In addition, a circuit to generate a plurality of output waveforms and gain control buffer 11 to drive a switching transistor are required for every switching transistor. Therefore, there are problems including an increase in circuit scale, an increase in cost, and an increase in power consumption in these circuits.

An object of the present invention is to provide an amplifier that avoids an increase in circuit scale and an increase in power consumption, and easily avoids the odd-order harmonics.

Solution to Problem

An amplifier according to an aspect of the present invention includes: a MOS transistor including a plurality of gate fingers or a plurality of MOS transistors each including a single gate finger; a dielectric capacitor that is added to each of the gate fingers; and a variable resistor that is connected between an input terminal to which an AC signal is input, and a gate input terminal, in which the variable resistor, gate resistors of the respective gate fingers, and the dielectric capacitors form a plurality of low pass filters having desired frequency characteristics, and the gate fingers are different from each other in width or length from the gate input terminal to an oxide diffusion (OD) area boundary.

Advantageous Effects of Invention

According to the present invention, it is possible to avoid an increase in circuit scale and an increase in power consumption, and easily avoids the odd-order harmonics.

DESCRIPTION OF EMBODIMENTS

Hereinafter, embodiments of the present invention will be described in detail with reference to the drawings. However, throughout the embodiments, the same components will be denoted by the same numerical references, and the redundant descriptions will not be repeated.

Embodiment 1

Figure 6:
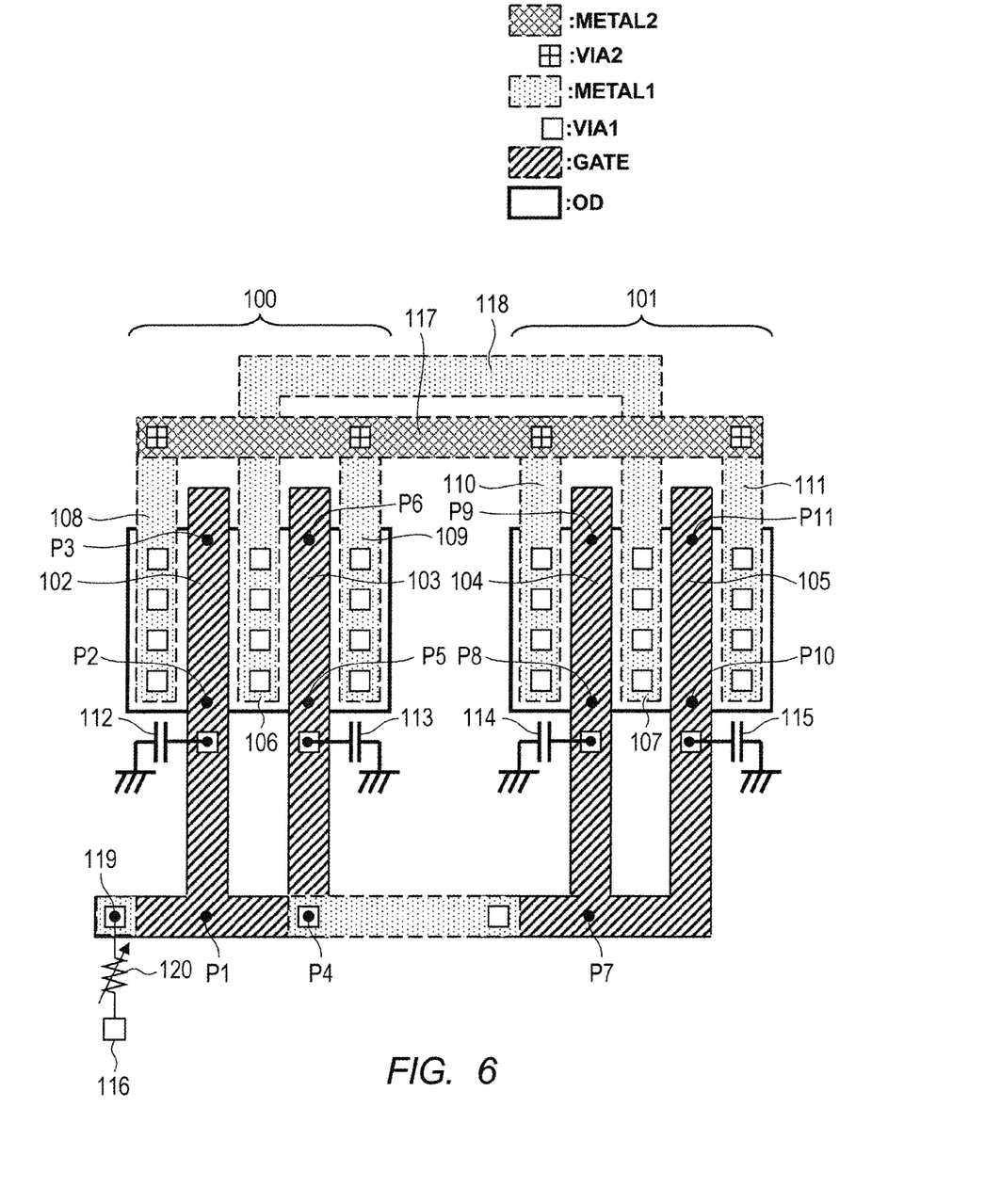
FIG. 6 is a plan view that illustrates a layout of a switching transistor of an amplifier according to Embodiment 1 of the present invention.

FIG. 6 is a plan view that illustrates a layout of a switching transistor of an amplifier according to Embodiment 1 of the present invention.

As illustrated in FIG. 6, the amplifier in Embodiment 1 includes a plurality of NMOS (N-channel Metal-Oxide-Semiconductor Field-Effect Transistor) transistors 100 and 101. NMOS transistor 100 includes a plurality of gate fingers 102 and 103 of NMOS transistor 100, sources 108 and 109, and drain 106. In addition, NMOS transistor 101 includes a plurality of gate fingers 104 and 105, sources 110 and 111, and drain 107.

Further, the source and the drain may be connected in such a way that the source becomes the drain and the drain becomes the source. In addition, the NMOS transistor may be a PMOS (P-channel Metal-Oxide-Semiconductor Field-Effect Transistor) transistor, and the plurality of NMOS transistors mean two NMOS transistors or more.

In FIG. 6, gate fingers 102 and 103 extensively protrude from an OD (Oxide Diffusion) area of NMOS transistor 100 toward gate input terminal 119, and gate fingers 104 and 105 also extensively protrude from an OD area of NMOS transistor 101 toward gate input terminal 119.

Gate fingers 102 to 105 are configured such that an electrode via to be connected to gate input terminal 119 is connected only to one side of the outside of the OD area. Therefore, since applied voltages by a transmission signal to the gate fingers are sequentially applied from the electrode via, the time required for forming a depletion layer to be generated in the OD area (i.e., an active area in which an element is formed and is used as an element area) is changed, and a delay time can be thus set.

In addition, gate fingers 103 and 104 are connected by an aluminum wire (a hatched portion denoted by METAL1 in the drawing).

Gate fingers 102 to 105 are respectively connected to dielectric capacitors 112 to 115, and a low pass filter is formed by a via resistor, a gate resistor, and the dielectric capacitor.

Further, in FIG. 6, for the convenience of explanation, the respective positions of the gate fingers are defined as positions P1 to P11. Positions P1, P4, and P7 represent positions at one ends on a side near gate input terminal 119 where gate fingers 102 to 105 are connected. In addition, positions P2, P5, P8, and P10 represent positions of gate fingers 102 to 105 in the OD area on a side near gate input terminal 119. Furthermore, positions P3, P6, P9, and P11 represent positions of gate fingers 102 to 105 in the OD area on a side opposite to gate input terminal 119.

The switching transistor of the amplifier of FIG. 6 is formed by NMOS transistors 100 and 101, and an AC signal (the transmission signal) is input from input terminal 116. In the switching transistor of FIG. 6, a first low pass filter is formed which includes variable resistor 120, a via resistor and a gate resistor between gate input terminal 119 and position P2, and dielectric capacitor 112.

The input AC signal is delayed by the first low pass filter, and thus a timing point at position P2 of FIG. 6 to turn current ON/OFF between the drain and the source is determined. In addition, a timing point at position P3 to turn current ON/OFF between the drain and the source is later than a timing point at position P2 to turn current ON/OFF in order to transfer the AC signal through the gate resistors at positions P2 and P3.

In addition, a timing point at position P5 to turn current ON/OFF between the drain and the source is determined to make a second low pass filter (which is formed by the gate resistors at positions P1 to P5 and dielectric capacitor 113) delay the AC signal which has been passed through the first low pass filter. In addition, a timing point at position P6 to turn current ON/OFF between the drain and the source is later than a timing point at position P5 to turn current ON/OFF in order to transfer the AC signal through the gate resistors at positions P5 and P6.

In addition, a timing point at position P8 to turn current ON/OFF between the drain and the source is determined to make a third low pass filter (which is formed by via resistors at positions P4 to P8, a wiring resistor, a gate resistor, and dielectric capacitor 114) delay the AC signal which has been passed through the first low pass filter and the second low pass filter. In addition, a timing point at position P9 to turn current ON/OFF between the drain and the source is later than a timing point at position P8 to turn current ON/OFF in order to transfer the AC signal through the gate resistors at positions P8 and P9.

Furthermore, a timing point at position P10 to turn current ON/OFF between the drain and the source is determined to make a fourth low pass filter (which is formed by the gate resistors at positions P7 to P10 and dielectric capacitor 115) delay the AC signal which has been passed through the first low pass filter, the second low pass filter, and the third low pass filter. In addition, a timing point at position P11 to turn current ON/OFF between the drain and the source is later than a timing point at position P10 to turn current ON/OFF in order to transfer the AC signal through the gate resistors at positions P10 and P11.

Through a series of these operations, the current between the drain and the source at every point is turned ON/OFF in order of positions P2, P3, P5, P6, P8, P9, P10, and P11 from the earliest one, each of the positions including a predetermine time interval of the delay time.

Herein, in a case where a frequency of the input AC signal is SIGfreq and the number of low pass filters is N, each delay time is designed to take a maximum value not exceeding the maximum value DelayMax of a delay amount satisfying Expression 1 below.

$$\text{DelayMax} < 1/(2 \times \text{SIGfreq} \times N) \quad \text{(Expression 1)}$$

Further, when the resistance values of the respective low pass filters are set to Res and capacitance values of the respective low pass filters are set to Cap, the maximum value DelayMax of the delay amount is uniquely obtained by a product of the resistance value Res and the capacitance value Cap.

The resistance value Res is a resistance value in which parasitic resistance in wires and vias is included, and the resistance value is designed by adjusting a width and a length of the gate resistor, or a width and a length of the wire, the number of wiring layers and vias, and the like. In addition, the capacitance value Cap is designed by adjusting areas and lengths of portions generating capacitances such as a metal-insulator-metal (MIM) capacitance, a MOS capacitance, a metal-oxide-metal (MOM) capacitance, a parasitic capacitance between the wires.

In this way, the MOS transistor of Embodiment 1 includes a plurality of gate fingers, and the dielectric capacitor is added to each of the plurality of gate fingers, so that a plurality of low pass filters having desired frequency characteristics are formed by the respective gate resistors and the respective dielectric capacitors.

Therefore, since the MOS transistor can generate a substantially sine waveform from a rectangular current waveform turning ON/OFF between the drain and the source by a single system of the input AC signal, it is possible to easily avoid the odd-order harmonics.

In addition, since there is no need to use a duty control circuit, a delay adjustment circuit, and a plurality of gain control buffers to individually perform driving, it is possible to avoid an increase in circuit scale and an increase in power consumption.

Further, dielectric capacitors 112 to 115 of FIG. 6 may have any configuration and be connected to any place as long as the delay characteristics of the above-mentioned low pass filter can be satisfied. In addition, dielectric capacitors 112 to 115 may be structured to vary the capacitance value, and for example, a plurality of structures of connecting a dielectric capacitor and a switch in series are connected in parallel, and the capacitance value may be added as much as the switch is short-circuited.

Similarly, any structure and any connection place may be used as long as variable resistor 120 is also configured to satisfy the delay characteristics of the low pass filter described above. For example, the drain and the source of the transistor may be configured as both end terminals of resistors and an ON-state resistance which controls the gate voltage of the transistor may be used.

In addition, in this embodiment, the description has been given with an example of the case where two MOS transistors having two gate fingers are connected, but the present invention is not limited thereto. For example, one MOS transistor having a plurality of gate fingers may be used, and a plurality MOS transistors having one gate finger may be used. In other words, all the MOS transistors in the amplifier may be configured to include a plurality of gate fingers.

In addition, the amplifier of the embodiment includes a power amplifier or a driver circuit.

In addition, two wiring layers are illustrated (see FIG. 6) in this embodiment, but the present invention is not limited thereto.

Embodiment 2

Figure 7:
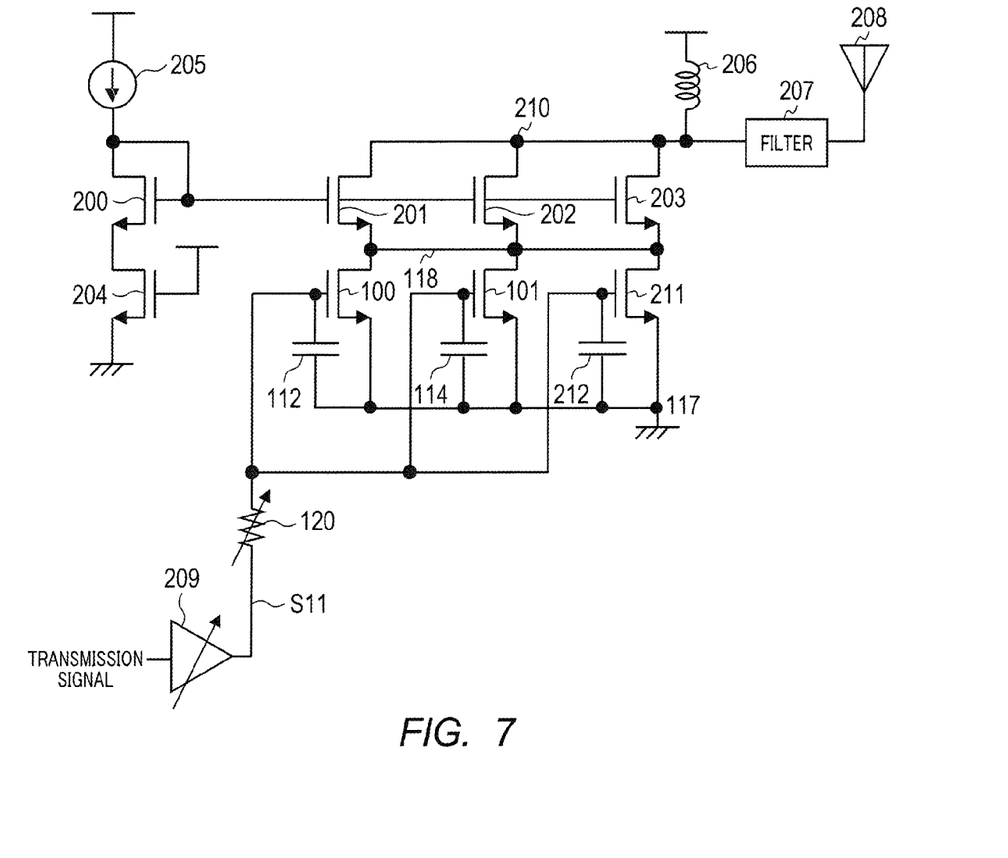
FIG. 7 is a circuit diagram of a radio transmission apparatus that includes an amplifier using a current mirror type cascode circuit according to Embodiment 2 of the present invention.

FIG. 7 illustrates a circuit diagram of a radio transmission apparatus that includes an amplifier using a current mirror type cascode circuit according to Embodiment 2 of the present invention.

NMOS transistors 200 to 203 of FIG. 7 form a current limit circuit, and are supplied with a current from constant current circuit 205. NMOS transistors 100, 101, and 211 are the switching transistors illustrated in Embodiment 1, and a case where each transistor has one gate finger is illustrated in this embodiment.

The respective gates are connected to electrodes of dielectric capacitors 112, 114, and 212 used for forming the low pass filter, and the other electrodes are grounded through bulk 117. Further, the ground point may be a power source.

In addition, in FIG. 7, the respective drains are bundled to the same output terminal 118, but the drain of NMOS transistor 100 may be connected to the source of NMOS transistor 201, the drain of NMOS transistor 101 may be connected to the source of NMOS transistor 202, and the drain of NMOS transistor 211 may be connected to the source of NMOS transistor 203.

NMOS transistor 204 is treated as an ON resistor used for matching the respective current densities of the current mirror circuits. Inductor 206 is a load choke inductor of the amplifier, and converts the switching current from drain 210 of NMOS transistors 201 to 203 into a voltage. The output waveform of drain 210 is output to antenna 208 through filter 207.

Gain control buffer 209 amplifies the input transmission signal, and drives NMOS transistors 100, 101, and 211 by a single system of the amplified signal. Further, the signal nodes from the output of gain control buffer 209 to the gates of NMOS transistors 100, 101, and 211 correspond to the plane structures from input terminal 116 to the gates through variable resistor 120 in FIG. 6, and the transmission signals input to the gates of NMOS transistor 100, 101, and 211 become waveforms having different timings within the same period. In addition, gain control buffer 209 is assumed to include a fixed gain buffer.

Figure 8:
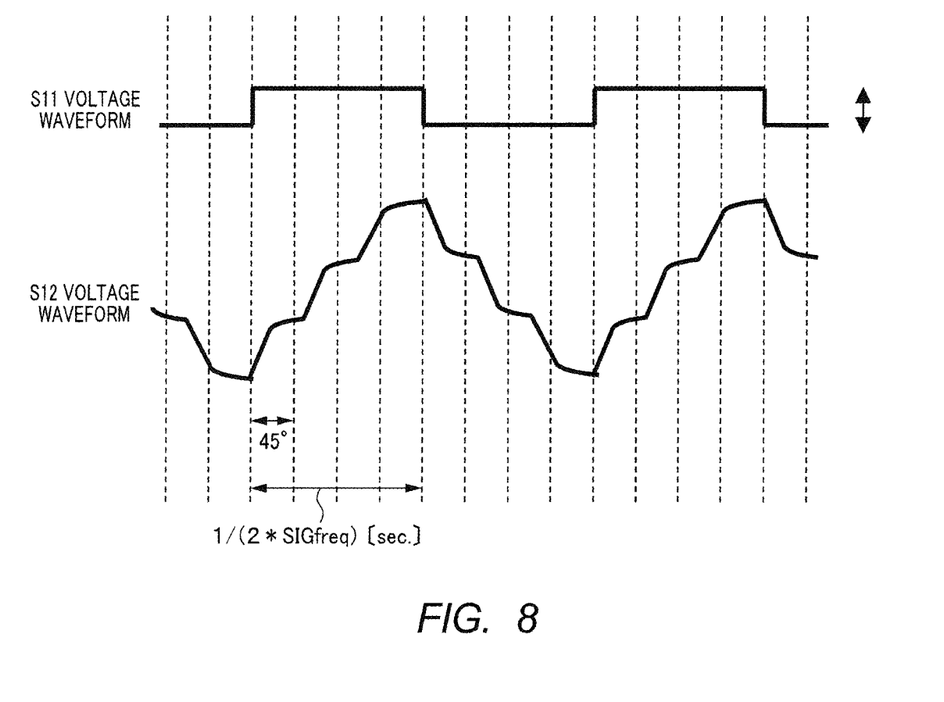
FIG. 8 is a diagram that illustrates a waveform of an output signal of a gain control buffer and a current waveform of a signal at an output terminal of a drain of a switching transistor in the circuit of FIG. 7.

FIG. 8 illustrates the waveform of output signal S11 of gain control buffer 209 in the circuit of FIG. 7 and the current waveform of signal S12 at output terminal 118 of the drain of the switching transistor. As can be seen from FIG. 8, the rectangular waveform output from gain control buffer 209, that is, the input signal of the amplifier is converted into a waveform close to a sine waveform at output terminal 118 of the drain, so that it is possible to avoid the odd-order harmonics.

Further, in this embodiment, the waveform of the transmission signal is illustrated as a non-modulated waveform, but a modulated waveform such as frequency modulation is used in actual use.

Embodiment 3

Figure 9:
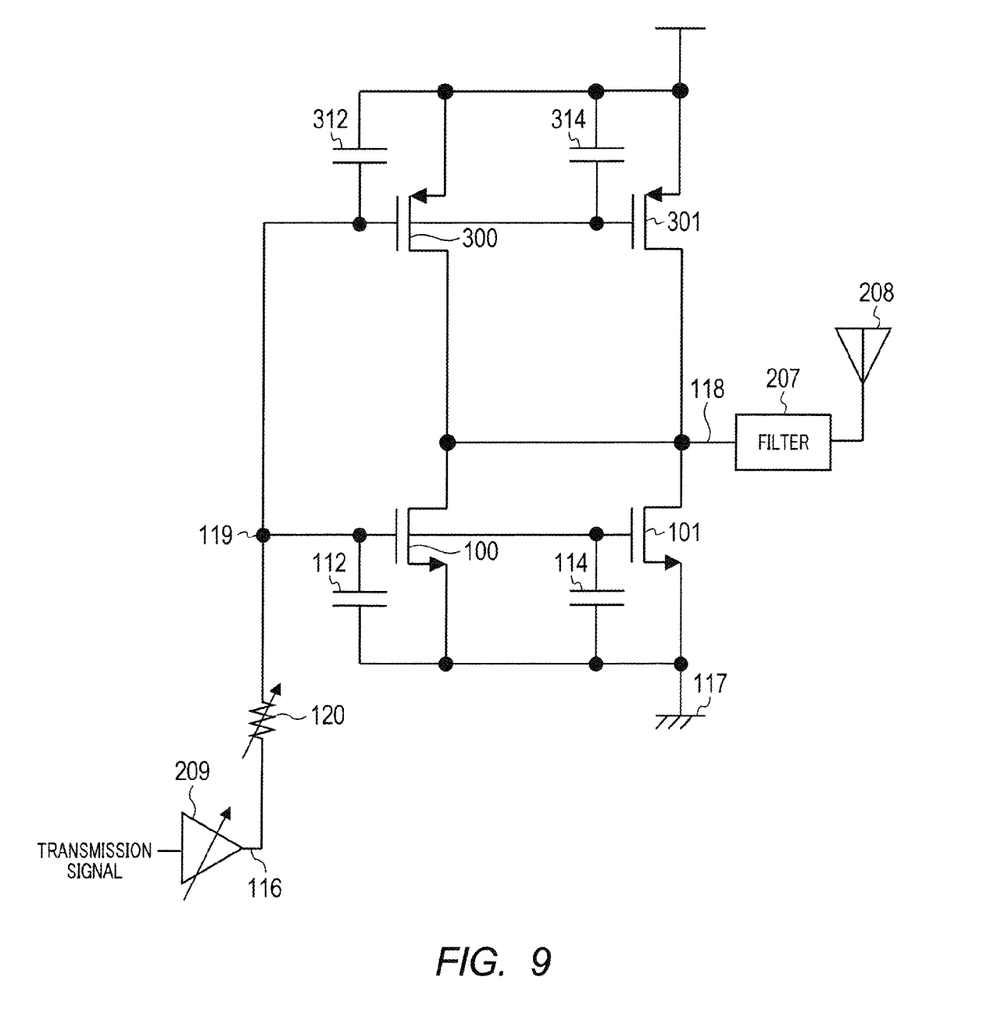
FIG. 9 is a circuit diagram of a radio transmission apparatus that includes an inverting amplifier employing a switching transistor according to Embodiment 3 of the present invention.

FIG. 9 illustrates a circuit diagram of a wireless transmission apparatus which includes an inverting amplifier using the switching transistor according to Embodiment 3 of the present invention.

NMOS transistors 100 and 101 and PMOS transistors 300 and 301 of FIG. 9 are the switching transistors illustrated in Embodiment 1, and a case where each transistor has one gate finger is illustrated in FIG. 9.

The gates of NMOS transistors 100 and 101 are connected to one-side electrodes of dielectric capacitors 112 and 114 used for forming the low pass filter, and the other-side electrodes are grounded through bulk 117. Further, the ground point may be the power source.

In addition, the gates of PMOS transistors 300 and 301 are connected to one-side electrodes of dielectric capacitors 312 and 314 used for forming the low pass filter, and the other-side electrodes are connected to the power source. Further, the ground point may be the ground.

In addition, the sources of NMOS transistors 100 and 101 are grounded through bulk 117, and the sources of PMOS transistors 300 and 301 are connected to the power source. The drains of NMOS transistors 100 and 101 and the drains of PMOS transistors 300 and 301 are connected to output terminal 118.

Gain control buffer 209 amplifies the input transmission signal, and drives NMOS transistors 100 and 101 and PMOS transistors 300 and 301 by a single system of the amplified signal. Further, the signal nodes from the output of gain control buffer 209 to the gates of NMOS transistors 100 and 101 and PMOS transistors 300 and 301 correspond to the plane structures from input terminal 116 to the gates through variable resistor 120 in FIG. 6, and the transmission signals input to the gates of NMOS transistors 100 and 101 and PMOS transistors 300 and 301 become waveforms having different timings within the same period.

As described above, the rectangular waveform output from gain control buffer 209, that is, the input signal of the amplifier is converted into a waveform close to a sine waveform at output terminal 118, so that it is possible to avoid the odd-order harmonics.

The disclosure of Japanese Patent Application No. 2013-035618, filed on Feb. 26, 2013, including the specification, drawings and abstract is incorporated herein by reference in its entirety.

INDUSTRIAL APPLICABILITY

The amplifier according to the present invention can be used for an electronic device in which an input AC signal is a rectangular waveform and there is a possibility that the output of the amplifier or a driver or the like contains odd-order harmonics. Examples of such an electronic device include a radio transmission apparatus, a laser printer using a laser driving driver, an optical communication transceiver, a CD, DVD or Blu-ray player/recorder, for example, and also an HDD, and FDD.

REFERENCE SIGNS LIST 100, 101, 201 to 204, 211 NMOS transistor
102 to 105 Gate finger
106, 107, 210 Drain
108 to 111 Source
112 to 115, 212, 312, 314 Dielectric capacitor
116 Input terminal
117 Bulk
118 Output terminal
119 Gate input terminal
120 Variable resistor
205 Constant current circuit
206 Inductor
207 Filter
208 Antenna
209 Gain control buffer
300, 301 PMOS transistor

The invention claimed is:

1. An amplifier comprising:
    a MOS transistor including a plurality of gate fingers or a plurality of MOS transistors each including a single gate finger;
    a dielectric capacitor that is added to each of the gate fingers; and
    a variable resistor that is connected between an input terminal to which an AC signal is input, and a gate input terminal, wherein
    the variable resistor, gate resistors of the respective gate fingers, and the dielectric capacitors form a plurality of low pass filters having desired frequency characteristics, and
    the gate fingers are different from each other in width or length from the gate input terminal to an oxide diffusion (OD) area boundary.

2. The amplifier according to claim 1, wherein timing points at which the AC signal is input to the gate fingers in the OD area are different from one another.

3. The amplifier according to claim 1, wherein an electrode via of the gate finger is connected only to one side of outside of the OD area.

4. The amplifier according to claim 1, wherein the AC signal is input by a single system.

5. The amplifier according to claim 1, wherein the dielectric capacitor has a variable capacitance.

6. The amplifier according to claim 1, wherein a signal transmission delay time for the AC signal input from the gate input terminal to arrive at each of the gate fingers in the OD area is set to a constant interval.

7. The amplifier according to claim 6, wherein the signal transmission delay time takes a maximum value not exceeding a maximum value "DelayMax" that is less than $1/(2\times SIGfreq \times N)$ where "SIGfreq" represents a frequency of the AC signal, and "N" represents a number of the plurality of low pass filters.

8. The amplifier according to claim 7, wherein the maximum value DelayMax is determined by a product of a resistance value of each of the low pass filters and a capacitance value of a corresponding one of the low pass filters.

9. A semiconductor integrated circuit comprising the amplifier according to claim 1.

10. A transmission apparatus comprising the amplifier according to claim 1.

11. An electronic device comprising the amplifier according to claim 1.

* * * * *